US009080820B2

(12) United States Patent
Bolton

(10) Patent No.: US 9,080,820 B2
(45) Date of Patent: Jul. 14, 2015

(54) HEAT DISSIPATION SWITCH

(75) Inventor: Douglas Aaron Bolton, Anaheim, CA (US)

(73) Assignee: The Boeing Company, Chicago, IL (US)

(*) Notice: Subject to any disclaimer, the term of this patent is extended or adjusted under 35 U.S.C. 154(b) by 645 days.

(21) Appl. No.: 13/477,414

(22) Filed: May 22, 2012

(65) Prior Publication Data

US 2013/0314202 A1    Nov. 28, 2013

(51) Int. Cl.
| | |
|---|---|
| *H01H 37/32* | (2006.01) |
| *F28F 13/00* | (2006.01) |
| *H01L 23/34* | (2006.01) |
| *F25B 1/00* | (2006.01) |
| *G05D 23/08* | (2006.01) |

(52) U.S. Cl.
CPC ............... *F28F 13/00* (2013.01); *H01L 23/34* (2013.01); *F28F 2013/008* (2013.01); *H01L 2924/0002* (2013.01)

(58) Field of Classification Search
CPC ........... F25B 1/00; F25B 21/02; G05D 23/08; F28F 27/02; F28F 2013/008; F28F 13/00; F28F 27/00; H05K 7/20; H05K 1/023; H05K 1/021; H05K 7/20963
USPC ............... 361/679.46–679.55, 700–712, 715, 361/719, 722–728; 165/80.2, 80.3, 104.33, 165/185, 96, 272, 276, 277; 257/414, 257/706–727; 174/15.1, 15.2, 16.3
See application file for complete search history.

(56) References Cited

U.S. PATENT DOCUMENTS

| | | | | |
|---|---|---|---|---|
| 3,519,067 | A | * | 7/1970 | Schmidt .................. 165/272 |
| 4,304,294 | A | | 12/1981 | Reisman et al. |
| 4,742,867 | A | * | 5/1988 | Walsh ..................... 165/96 |
| 5,131,456 | A | * | 7/1992 | Wu ......................... 165/277 |
| 7,411,792 | B2 | * | 8/2008 | Richards et al. ......... 361/704 |
| 7,752,866 | B2 | * | 7/2010 | Vaidyanathan et al. ... 62/383 |
| 8,215,377 | B1 | * | 7/2012 | Monson et al. .......... 165/46 |
| 2003/0058619 | A1 | * | 3/2003 | Morris et al. ............ 361/700 |
| 2006/0066434 | A1 | * | 3/2006 | Richards et al. ......... 337/14 |
| 2007/0205473 | A1 | * | 9/2007 | Youngner et al. ........ 257/414 |
| 2007/0241635 | A1 | * | 10/2007 | Hunter et al. ........... 310/307 |

(Continued)

FOREIGN PATENT DOCUMENTS

| | | | | |
|---|---|---|---|---|
| JP | 11351679 | A | * 12/1999 | ............. F25B 1/00 |
| WO | WO 2006/071795 | A2 | * 7/2006 | |

OTHER PUBLICATIONS

Gilmore, David G., "Spacecraft Thermal Control Handbook, vol. 1 Fundamental Technologies", Second Edition, p. 353 to p. 370, The Aerospace Press, El Segundo, CA, 2002.

*Primary Examiner* — Michail V Datskovskiy
(74) *Attorney, Agent, or Firm* — Baldauff IP, LLC; Michael J. Baldauff, Jr.

(57) ABSTRACT

The disclosure herein provides for heat dissipation switches and systems, as well as their use for dissipating excess heat from a heat source. Various aspects of a heat dissipation switch may include a thermally isolating material having a number of conductive element cavities. A number of thermally switched conductive elements may nest within the conductive element cavities either independently or as part of a thermally switched sheet. The material of the thermally switched conductive elements may be configured to deform in response to a temperature change through a threshold temperature or temperature range in order to create or interrupt heat flow paths from the heat source to a heat sink.

28 Claims, 12 Drawing Sheets

(56) References Cited

U.S. PATENT DOCUMENTS

2009/0321044 A1* 12/2009 Hernon et al. ............... 165/80.2
2011/0168378 A1* 7/2011 Hsu ............................... 165/276
2013/0141872 A1* 6/2013 Schwartz ...................... 361/719

* cited by examiner

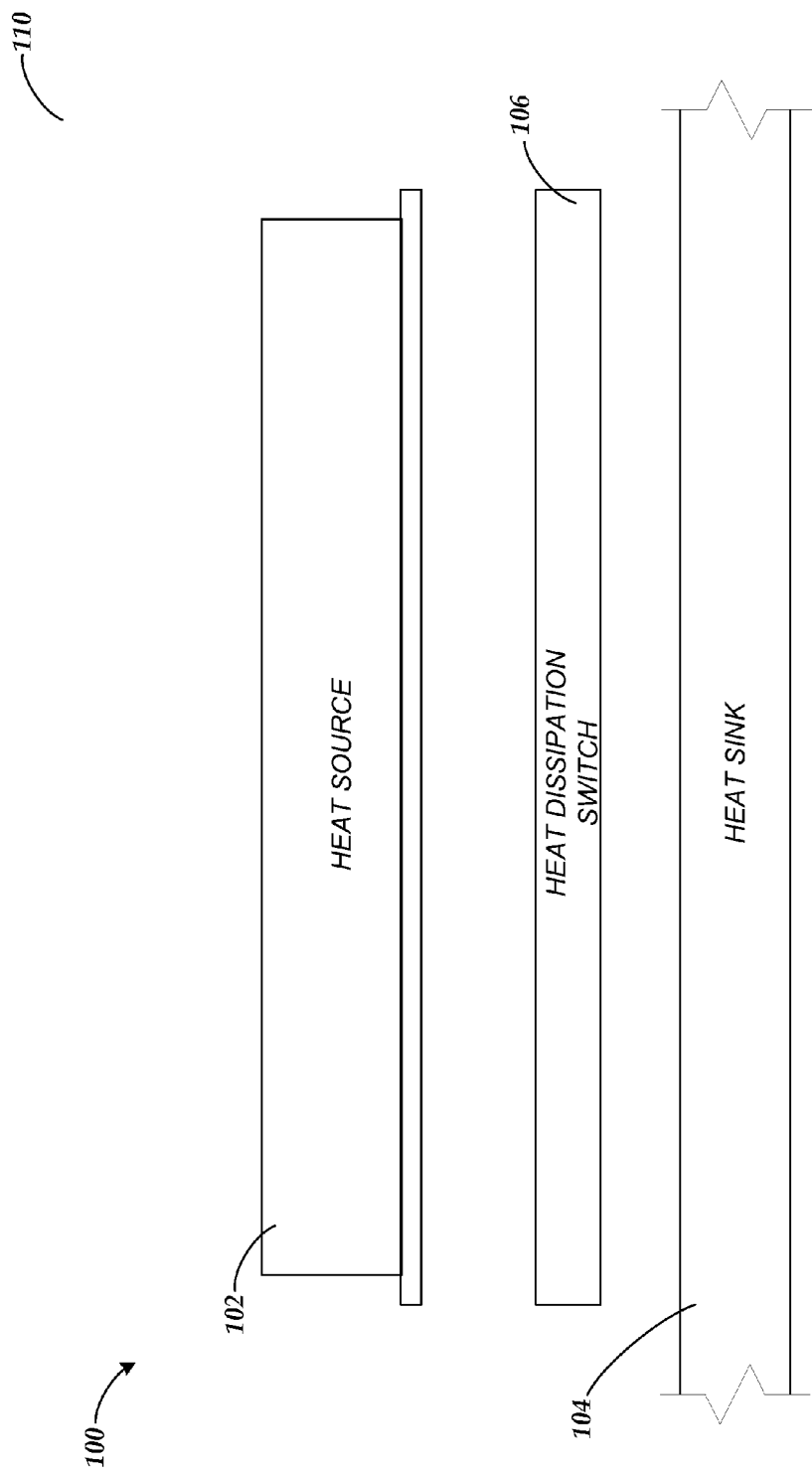

HEAT DISSIPATION SWITCH

BACKGROUND

Electrical components are used throughout virtually all industries. One characteristic of most electrical components is that they often produce heat during operation. While this heat is not a problem in many applications, other applications dictate that excess heat be sufficiently removed from the applicable electrical components in order to prevent damage or malfunctioning of the electrical components or of other components of an associated system.

There are numerous ways in which heat is typically removed from a heat source such as an electrical component. For example, a heat source may be thermally coupled to a heat sink having a higher thermal conductivity and/or lower temperature than the heat source. In doing so, heat produced by the heat source continuously flows from the heat source to the heat sink where it may be dissipated into the ambient environment. While this solution may be relatively simple and cost effective, one disadvantage is that because the heat source and heat sink are continuously coupled to one another, heat or cold may undesirably flow in a reverse direction from the ambient environment to the electrical component during times in which the component is not producing excess heat.

Another conventional method for removing excess heat from a heat source is to use a radiator or other heat exchanger. There are numerous types of heat exchangers, most of which utilize a coolant or airflow circulated around the heat source to remove the excess heat. A disadvantage to these conventional systems is that they may be too bulky and expensive. In addition, many of these conventional systems require pumps or actuators, which presents potential reliability issues.

Due to the size and operational parameters of many conventional heat exchange systems, these systems must be incorporated into an implementation early during the design phase of the system. However, there may be applications in which it is desirable to provide or supplement heat removal capabilities after the corresponding heat-producing system is in production or operation. In these applications, it may be desirable that the heat removal solution be compact and simple, allowing for the application and even customization of the heat removal solution for a particular component or portion of a heat-producing system.

Accordingly, there exists a need for a simplified, compact, and cost effective device and system that selectively provides a heat flow path from a heat source to a heat sink only during operational periods in which excess heat is generated. It is with respect to these considerations and others that the disclosure made herein is presented.

SUMMARY

It should be appreciated that this Summary is provided to introduce a selection of concepts in a simplified form that are further described below in the Detailed Description. This Summary is not intended to be used to limit the scope of the claimed subject matter.

Apparatus, methods, and systems described herein provide for selective heat transfer between a heat source and heat sink according to pre-determined operational temperatures. According to one aspect, a heat dissipation switch may include a layer of thermally isolating material having a number of conductive element cavities. A number of thermally switched conductive elements may be positioned within the conductive element cavities. The thermally switched conductive elements may be configured to deform in response to a threshold temperature.

According to another aspect, a method of removing heat from a heat source is provided. The method may include providing a layer of thermally isolating material between the heat source and a heat sink. The thermally isolating material may have a number of conductive element cavities, in which a number of thermally switched conductive elements may be provided. The thermally switched conductive elements may be exposed to a threshold temperature, and in response, deform to create and/or eliminate a heat flow path from the heat source to the heat sink.

According to yet another aspect, a heat dissipation system may include a heat source, a heat sink, and a heat dissipation switch positioned between the heat source and the heat sink. The heat dissipation switch may include a layer of thermally isolating material having a number of conductive element cavities with a number of thermally switched conductive elements positioned within the conductive element cavities. The thermally switched conductive elements may be configured to deform in response to a threshold temperature to create and/or eliminate a heat flow path between the heat source and the heat sink.

The features, functions, and advantages that have been discussed can be achieved independently in various embodiments of the present disclosure or may be combined in yet other embodiments, further details of which can be seen with reference to the following description and drawings.

BRIEF DESCRIPTION OF THE DRAWINGS

FIG. 1 is an exploded side view of an illustrative heat dissipation system according to various embodiments presented herein;

DETAILED DESCRIPTION

Figure 2A:
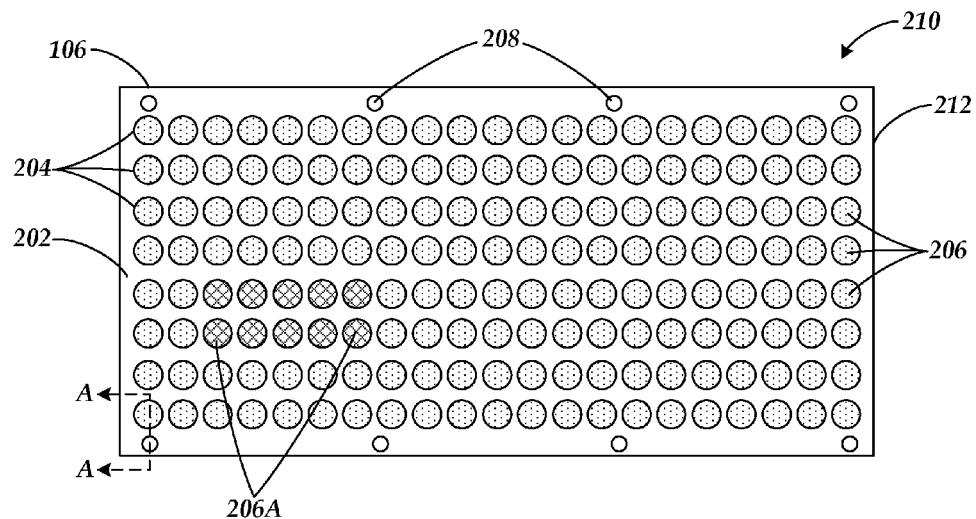
FIG. 2A is a top view of a heat dissipation switch configured for a surface mount application according to various embodiments presented herein.

The following detailed description is directed to apparatus, systems, and methods for removing excess heat from a heat source. As discussed above, traditional methods for heat removal are commonly bulky, expensive, and/or complex. There are numerous applications that would benefit from a heat dissipation switch that is small and reliable, inexpensive to manufacture, relatively maintenance free, and that could be customized for a particular electrical component and installed at any point during or after the design and manufacturing of a system that incorporates the electrical component.

As an example, a suitable application for the concepts described herein may include components that operate in space. Electrical components in space may be subjected to extremely cold temperatures when not operating, but still produce excess heat during operations. It may not be desirable to have a heat sink permanently or fixedly attached to a component since the heat sink could effectively provide a thermal path for the extremely low temperatures to the component when not in operation. Additionally, it is desirable to minimize the weight and size of all components to be used in a space environment due to the cost and payload space restrictions associated with space applications. It is further desirable to provide components and systems for space applications that require no maintenance and are as reliable as possible. The disclosure provided herein provides a heat dissipation switch that satisfies these aspects that are not provided by conventional solutions. It should be appreciated that while the example implementation discussed above is in the context of heat dissipation within a space environment, the disclosure provided herein may be equally applicable to any environment and application in which it is desirable to remove excess heat from a heat source.

Utilizing the concepts and technologies described herein, a heat dissipation switch utilizing thermally conductive elements to selectively create heat flow paths from a heat source to a heat sink according to a threshold temperature or temperature range will be provided. In the following detailed description, references are made to the accompanying drawings that form a part hereof, and which are shown by way of illustration, specific embodiments, or examples. Referring now to the drawings, in which like numerals represent like elements through the several figures, a heat dissipation switch and system, as well as methods for removing heat from a heat source, will be described.

FIG. 1 shows an exploded side view of a heat dissipation system 100 according to an illustrative embodiment. According to this embodiment, the heat dissipation system 100 includes a heat source 102, a heat sink 104, and a heat dissipation switch 106. The heat dissipation switch 106 is positioned between the heat source 102 and the heat sink 104. As will be described in detail below, the heat dissipation switch is configured to thermally isolate the heat source 102 from the heat sink 104 at predetermined temperatures or temperature ranges, and to thermally couple the heat source 102 to the heat sink 104 at other predetermined temperatures or temperature ranges. The heat source 102 may be any electronic or other component, circuit, device, or system that produces excess heat to be removed. The heat sink 104 may be any thermally conductive material having a thermal conductivity and/or temperature that facilitates heat flow in a direction from the heat source 102 to the heat sink 104 when the heat sink 104 is thermally coupled to the heat source 102.

Figure 2B:
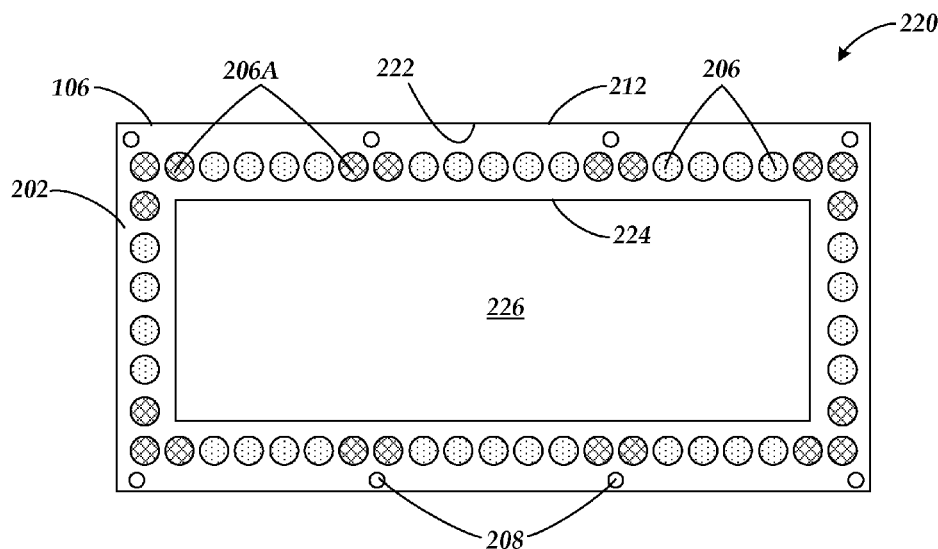
FIG. 2B is a top view of a heat dissipation switch configured for an edge mount application according to various embodiments presented herein.

Turning to FIGS. 2A and 2B, embodiments of the heat dissipation switch 106 will now be described. FIG. 2A shows a top view of a heat dissipation switch 106 configured according to a surface mount configuration 210 for coupling to a continuous area of a heat source 102 to be cooled. According to this embodiment, the heat dissipation switch 106 includes a thermally isolating material 202 with a number of conductive element cavities 204. In this example, the conductive element cavities 204 are arranged according to an array, but it should be appreciated that any desired arrangement of the conductive element cavities 204 may be used as suitable for the specific implementation of the heat dissipation switch 106.

As will be further shown and described below with respect to FIG. 3, the conductive element cavities 204 may be apertures or compartments within the thermally isolating material 202 for nesting thermally switched conductive elements 206 within. The thermally isolating material 202 may include any material having a thermal conductivity that prevents or restricts heat flow from the heat source 102 and heat sink 104 positioned on opposing sides of the thermally isolating material 202. Examples of suitable material include but are not limited to polymers, ceramics, and composite materials. The heat dissipation switch 106 may be mounted to the heat source 102 or the heat sink 104 via mounting apertures 208, adhesive, fasteners, or any other suitable means. The mounting apertures 208 may align with existing mounting apertures used to traditionally mount the heat source 102 to the heat sink 104 or other component.

The creation of the heat flow paths to allow for the transfer of excess heat from the heat source 102 to the heat sink 104 occurs via the thermally switched conductive elements 206. The thermally switched conductive elements 206 may be any material that is capable of deformation in response to a temperature change. This deformation allows the thermally switched conductive elements 206 to extend through the conductive element cavities 204 of the thermally isolating material 202 to contact the heat source 102 on one side of the heat dissipation switch 106 and the heat sink 104 on the opposing side of the heat dissipation switch 106 in order to create a heat flow path for heat transfer from the heat source 102 to the heat sink 104. There are various materials and material combinations that may allow for this deformation. Although two embodiments will be described herein for utilization of two different types of material for the thermally switched conductive elements 206, any type of material that will provide the described deformation in response to a predetermined temperature or temperature range may be used without departing from the scope of this disclosure.

The first type of material to be used with the thermally switched conductive elements 206 is a bimetallic material. Bimetallic materials include at least two materials bonded together, each having a different coefficient of thermal expansion. In the embodiments shown in the various figures, the thermally switched conductive elements 206 are generally circular or disk-shaped when viewed from the top. When the disk of bimetallic material heats until its temperature rises above a threshold temperature or temperature range associated with the materials, stresses within the disk that are created from the differential expansion of the two materials cause the disk to deform and deflect. When the temperature of the disk subsequently drops below the threshold temperature or temperature range, the materials contract, which relieves the stresses and allows the bimetallic material to return to its original shape.

In practice, the use of bimetallic materials provides thermally switched conductive elements 206 that are capable of displacing outward from the outer surfaces of the thermally isolating material 202 when the heat source 102 raises the temperature of the thermally switched conductive elements 206 beyond the threshold temperature of the associated bimetallic material. This displacement allows the thermally switched conductive elements 206 to contact surfaces of the heat source 102 and heat sink 104, creating a heat flow path that allows for excess heat from the heat source 102 to be transferred to the heat sink 104. When the heat source 102 is no longer operating or otherwise producing excess heat, the temperature of the thermally switched conductive elements 206 lowers beyond the threshold temperature of the bimetallic material, allowing the thermally switched conductive elements 206 to return to their original shape, which breaks the contact with the heat source 102 and heat sink 104 and interrupts the heat flow path.

The second type of material that may be used with the thermally switched conductive elements 206 is a shape memory alloy. Shape memory alloys are known materials that are made up of a mixture of elements. This type of alloy expands and contracts according to the temperature of the material. The expansion and contraction characteristics, as well as the corresponding activation temperature, are dependent on the particular composition of the alloy. Configuring shape memory alloys to deform in a predictable manner in response to an increase or decrease in temperature allows for the selective creation and interruption of heat transfer paths through the heat dissipation switch 106.

The surface mount configuration 210 of the heat dissipation switch 106 of FIG. 2A is designed to position thermally isolating material 202 and thermally switched conductive elements 206 in contact with a pre-defined surface area of the heat source 102 to provide heat transfer capabilities. Essentially, the heat dissipation switch 106 configured in the surface mount configuration 210 has a continuous surface area of thermally isolating material 202 and thermally switched conductive elements 206 that is bounded by a perimeter 212 of the thermally isolating material 202.

In contrast, FIG. 2B illustrates a top view of a heat dissipation switch 106 configured according to an edge mount configuration 220 for coupling to an edge or customized area of a heat source 102 to be cooled. According to the edge mount configuration 220, the heat dissipation switch 106 has a surface area bordered on an outer edge 222 by a perimeter 212 of the thermally isolating material 202 and on an inner edge 224 by a non-switched area 226 that is central to the heat dissipation switch 106 in this example. The edge mount configuration 220 may be useful in applications in which it is desirable to dissipate heat from the edges or walls of a heat source 102 rather than an entire area of the heat source 102. It should be obvious from the examples of the surface mount configuration 210 and the edge mount configuration 220 that the heat dissipation switch 106 disclosed herein may be configured according to any desired size, shape, and configuration of the interface between the heat dissipation switch 106 and the heat source 102.

Further customization of the performance characteristics of the heat dissipation switch 106 may be provided by customizing the type and positioning of the thermally switched conductive elements 206 within the thermally isolating material 202. As seen in FIGS. 2A and 2B, one or more subsets of the thermally switched conductive elements 206, such as the custom thermally switched conductive elements 206A, may be positioned within any desired conductive element cavities 204 according to the desired heat dissipation positioning and performance criteria of the heat source 102. For example, the custom thermally switched conductive elements 206A (shown with hatching to distinguish from other thermally switched conductive elements 206) may be localized in particular areas in which the differing heat flow characteristics of the custom thermally switched conductive elements 206A are desirable.

The custom thermally switched conductive elements 206A, for example, may include bimetallic material having a lower threshold temperature than the other thermally switched conductive elements 206 so that the custom thermally switched conductive elements 206A activate and deform earlier than the surrounding thermally switched conductive elements 206 as the temperature of the heat source 102 rises. In doing so, the areas of the heat source 102 that interface with the custom thermally switched conductive elements 206A would dissipate excess heat earlier than the other areas of the heat source 102, at least until the temperature rises through the threshold temperature associated with the thermally switched conductive elements 206.

Alternatively or additionally, the custom thermally switched conductive elements 206A may be configured in an alternative shape or size, or an alternative material having varying deformation characteristics, allowing for the custom thermally switched conductive elements 206A to interface with the heat source 102 and/or heat sink 104 in a different way. As an example, the custom thermally switched conductive elements 206A may be configured to displace farther, or with more force, than the thermally switched conductive elements 206 in order compensate for surface distortions or irregularities, or to apply a greater contact pressure against the heat source 102 and/or the heat sink 104 to improve heat transfer in those areas. The increased displacement may result from the choice of material, size, shape, thickness, or some combination thereof, of the custom thermally switched conductive elements 206A. In general, the thermally switched conductive elements 206 and custom thermally switched conductive elements 206A are represented in the various figures as being generally disk-shaped. It should be understood that these elements may be shaped and sized according to the particular implementation.

Figure 3:
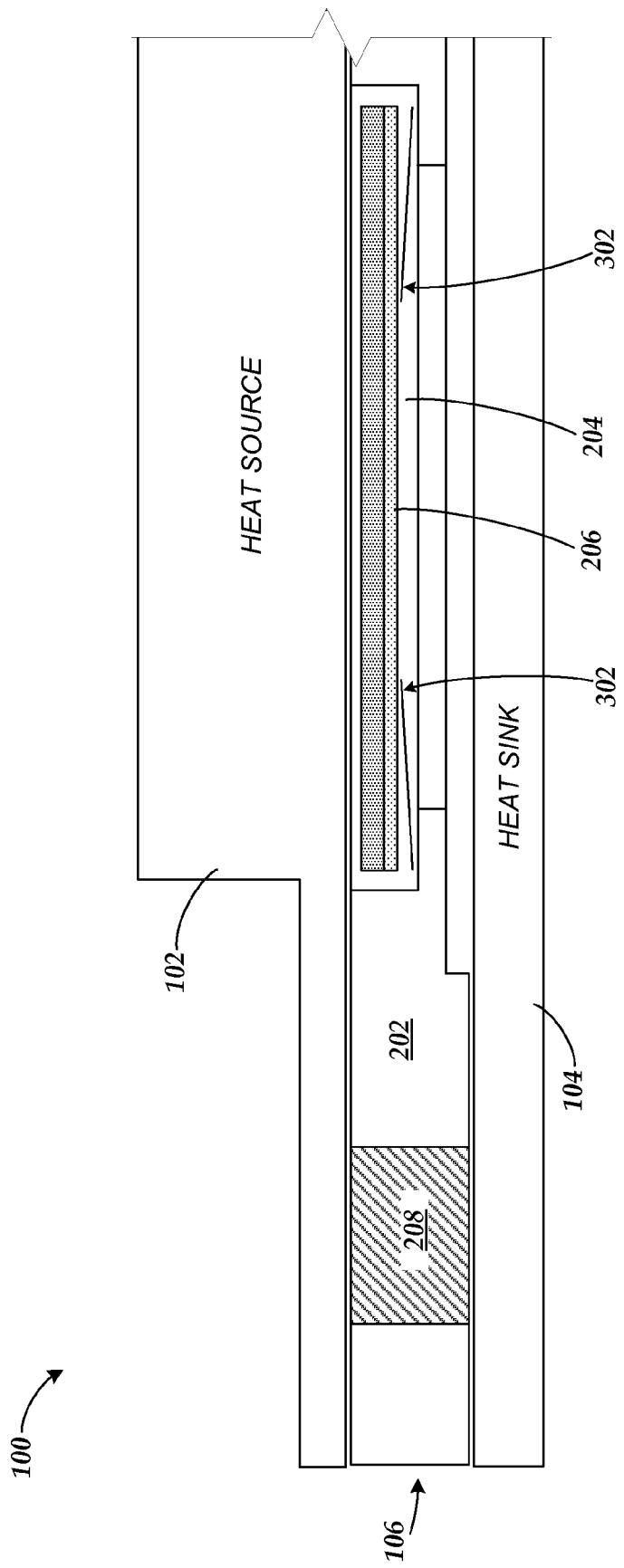
FIG. 3 is a cross-sectional view of a heat dissipation system taken along line A-A of FIG. 2A, illustrating an un-actuated configuration of a thermally switched conductive element positioned within a conductive element cavity of a layer of thermally isolating material according to various embodiments presented herein.

FIG. 3 shows a cross-sectional view of a heat dissipation system 100 taken along line A-A of FIG. 2A. As shown, the heat dissipation switch 106 is sandwiched between the heat source 102 and the heat sink 104. This view illustrates an example in which the thermally switched conductive elements 206 are positioned within the conductive element cavities 204 of the thermally isolating material 202. The thermally switched conductive element 206 is shown in an un-actuated configuration in which there is no heat flow path created by the heat dissipation switch 106 between the heat source 102 and the heat sink 104.

The thermally switched conductive elements 206 in FIG. 3 are illustrated with two different layers having two different shadings in order to represent a bimetallic material. As discussed above, the thermally switched conductive elements 206 may alternatively include shape memory alloys. Throughout a majority of the remaining figures, the thermally switched conductive elements 206 are depicted without shading or layers for clarity purposes.

In this example, the conductive element cavity 204 is configured with two biasing members 302. These biasing members 302 may be springs or other components that apply a biasing pressure against the thermally switched conductive element 206. The biasing members 302 may accelerate or decelerate activation or deactivation of the corresponding thermally switched conductive element 206. It should be appreciated that the heat dissipation switches 106 of this disclosure are not limited to the use or placement of the biasing members 302. For example, there may additionally or alternatively be biasing members 302 positioned to engage a top surface of the thermally switched conductive element 206 facing the heat source 102.

Figure 4:
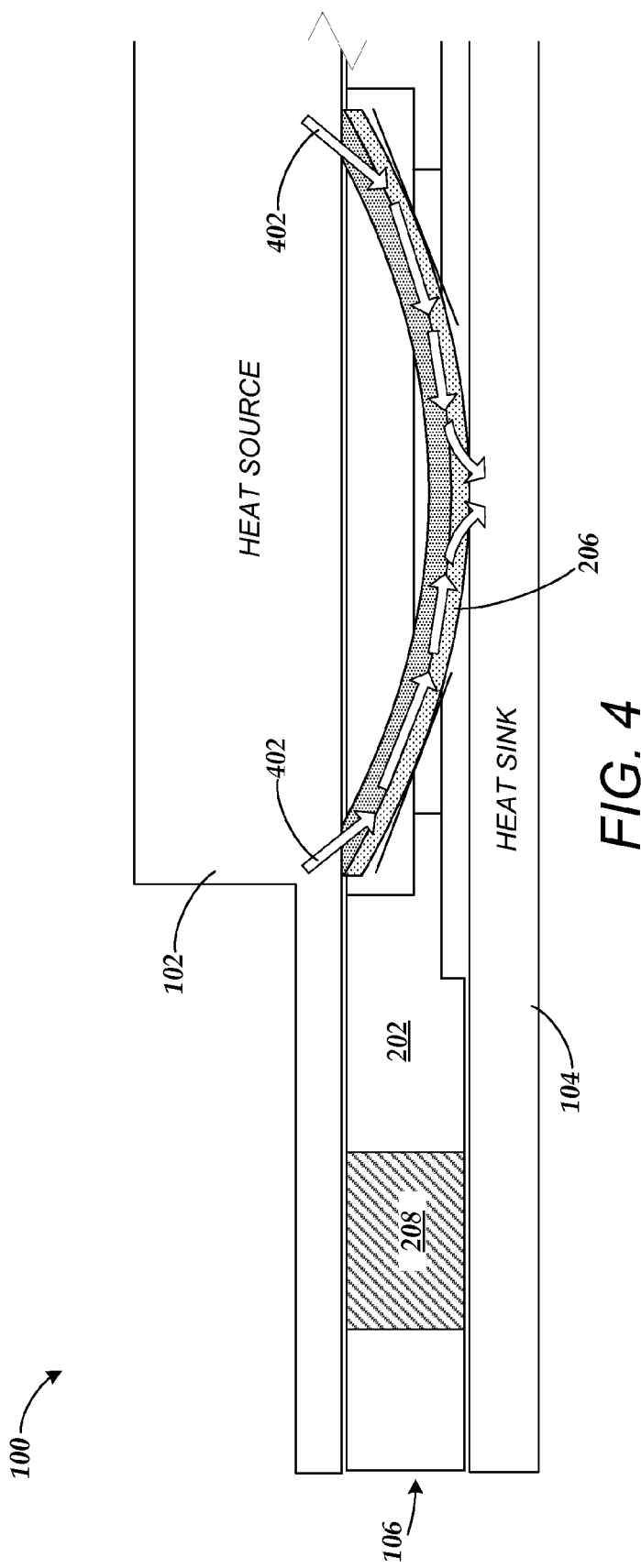
FIG. 4 is a cross-sectional view of the heat dissipation system taken along line A-A of FIG. 2A, illustrating an actuated configuration of the thermally switched conductive element positioned within the conductive element cavity of the layer of thermally isolating material according to various embodiments presented herein.

FIG. 4 shows the heat dissipation system 100 of FIG. 3 with the thermally switched conductive element 206 of the heat dissipation switch 106 configured in an actuated configuration. When the thermally switched conductive element 206 deforms in response to an increase in temperature, the thermally switched conductive element 206 contacts the surface of the heat source 102 and the surface of the heat sink 104 to create heat flow paths 402 for transferring excess heat from the heat source 102 to the heat sink 104. After cooling below the threshold temperature associated with the material of the thermally switched conductive element 206, the thermally switched conductive element 206 will deactivate and return to its original un-actuated shape, breaking the contact with the heat source 102 and heat sink 104 to interrupt the heat flow paths 402.

Figure 5:
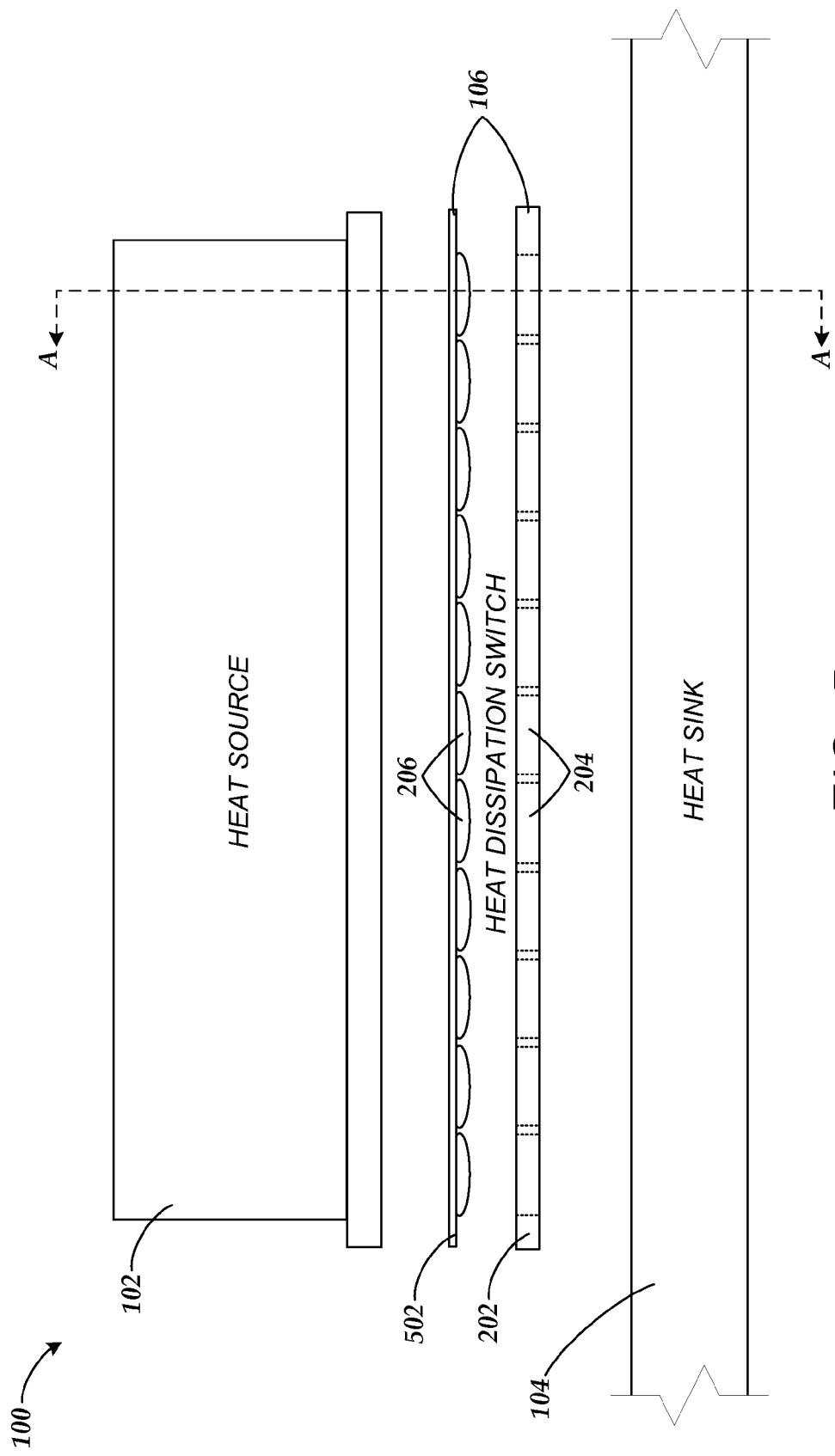
FIG. 5 is an exploded side view of an illustrative heat dissipation system showing a layer of thermally isolating material and a thermally switched sheet of conductive elements according to various embodiments presented herein.

Turning to FIG. 5, an alternative embodiment of the heat dissipation switch 106 will now be discussed. FIG. 5 is an exploded side view of a heat dissipation system 100 according to various embodiments in which the heat dissipation switch 106 includes a layer of thermally isolating material 202 and a thermally switched sheet 502 of conductive elements 206. The embodiments of the heat dissipation switch 106 discussed above with respect to FIGS. 2-4 utilized a single layer of thermally isolating material 202 with individual thermally switched conductive elements 206 that are not coupled to one another, but rather nested generally unsecured within the conductive element cavities 204 of the thermally isolating material 202. In contrast, in the configuration shown in FIGS. 5-11, the heat dissipation switch 106 includes a layer of thermally isolating material 202 and a thermally switched sheet 502 of conductive elements positioned on a top surface of the thermally isolating material 202.

The thermally switched sheet 502 includes a number of thermally switched conductive elements 206 that are thermally coupled to one another and nest within the conductive element cavities 204 of the thermally isolating material 202. The thermally switched sheet 502 may be manufactured from bimetallic material or shape memory alloy with the thermally switched conductive elements 206 stamped into the desired shape from the sheet of material. Alternatively, the thermally switched conductive elements 206 of bimetallic or shape memory alloy may be bonded to a metallic sheet or sheet of any suitable material having a thermal conductivity conducive to produce a heat flow path between the heat source 102 and the heat sink 104 when the thermally switched conductive elements 206 are activated.

Figure 6A:
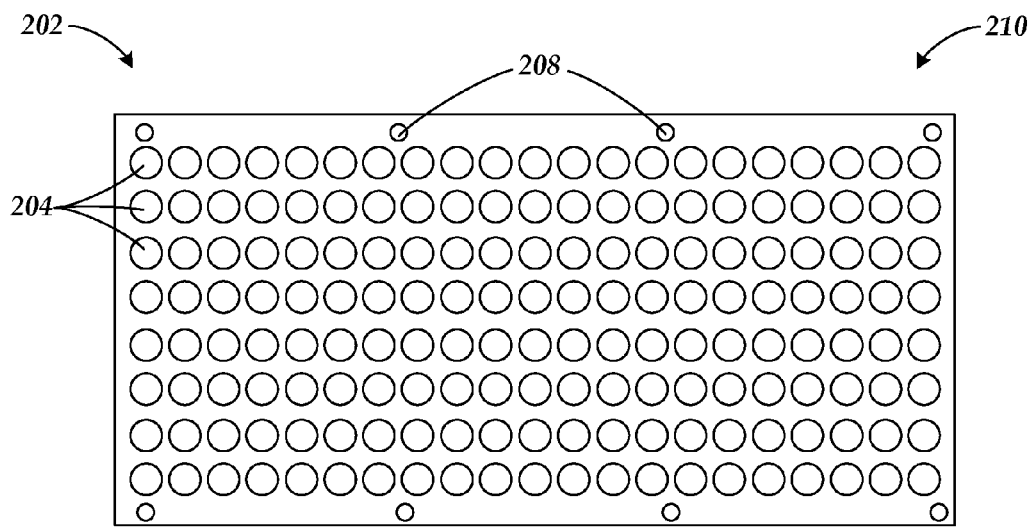
FIG. 6A is a top view of a layer of thermally isolating material configured for a surface mount application according to various embodiments presented herein.
Figure 6B:
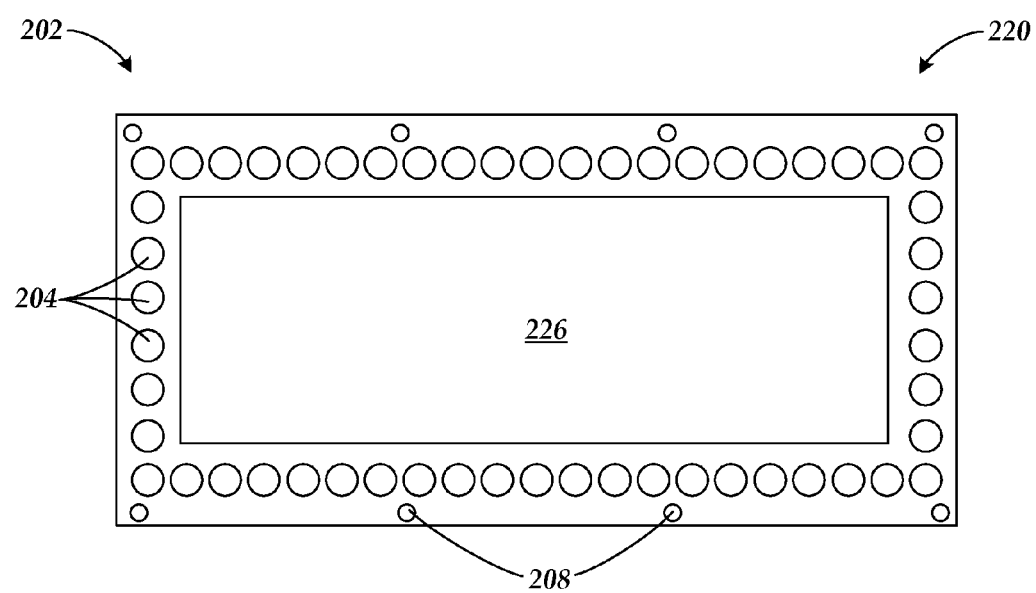
FIG. 6B is a top view of a layer of thermally isolating material configured for an edge mount application according to various embodiments presented herein.
Figure 7A:
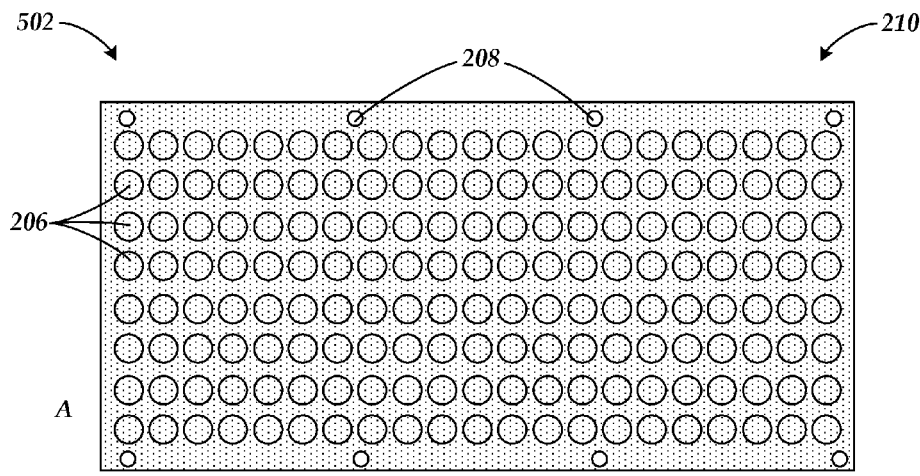
FIG. 7A is a top view of a thermally switched sheet of conductive elements configured for a surface mount application according to various embodiments presented herein.
Figure 7B:
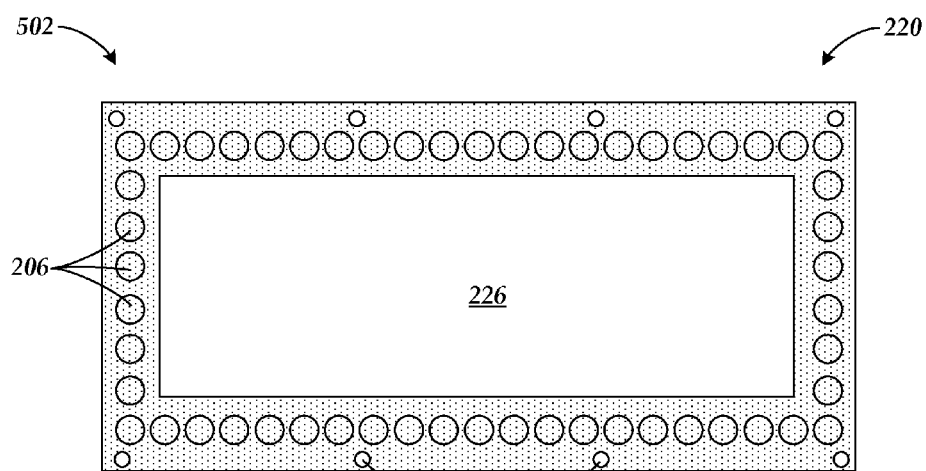
FIG. 7B is a top view of a thermally switched sheet of conductive elements configured for an edge mount application according to various embodiments presented herein.

FIGS. 6A and 6B show top views of a layer of thermally isolating material 202 configured according to a surface mount configuration 210 and an edge mount configuration 220, respectively. As shown, the thermally isolating material 202 includes a number of conductive element cavities 204 in which the thermally switched conductive elements 206 of the thermally switched sheet 502 will nest. FIGS. 7A and 7B show top views of a thermally switched sheet configured according to a surface mount configuration 210 and an edge mount configuration 220, respectively. As previously discussed, the thermally switched sheet 502 may include any number of thermally switched conductive elements 206 coupled to one another and configured to nest within the corresponding conductive element cavities 204 of the adjacent thermally isolating material 202. According to one embodiment, the thermally switched sheet 502 may be adhesively bonded to the surface of the heat source 102 to be cooled. According to alternative embodiments, the thermally switched sheet 502, as well as the thermally isolating material 202, may be coupled to the heat source 102 using fasteners or other suitable means via mounting apertures 208.

Figure 8:
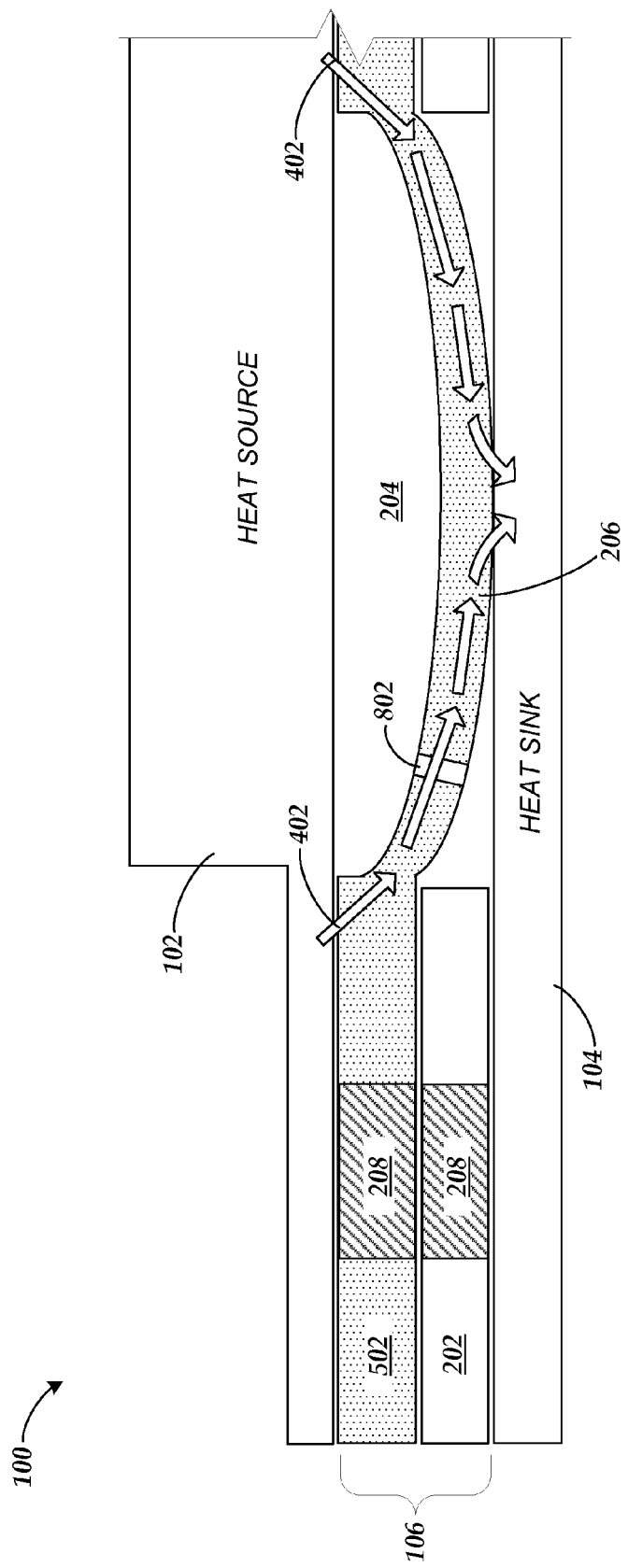
FIG. 8 is a cross-sectional view of a heat dissipation system taken along line A-A of FIG. 5, illustrating an un-actuated configuration of a thermally switched sheet of a heat dissipation switch according to various embodiments presented herein.
Figure 9:
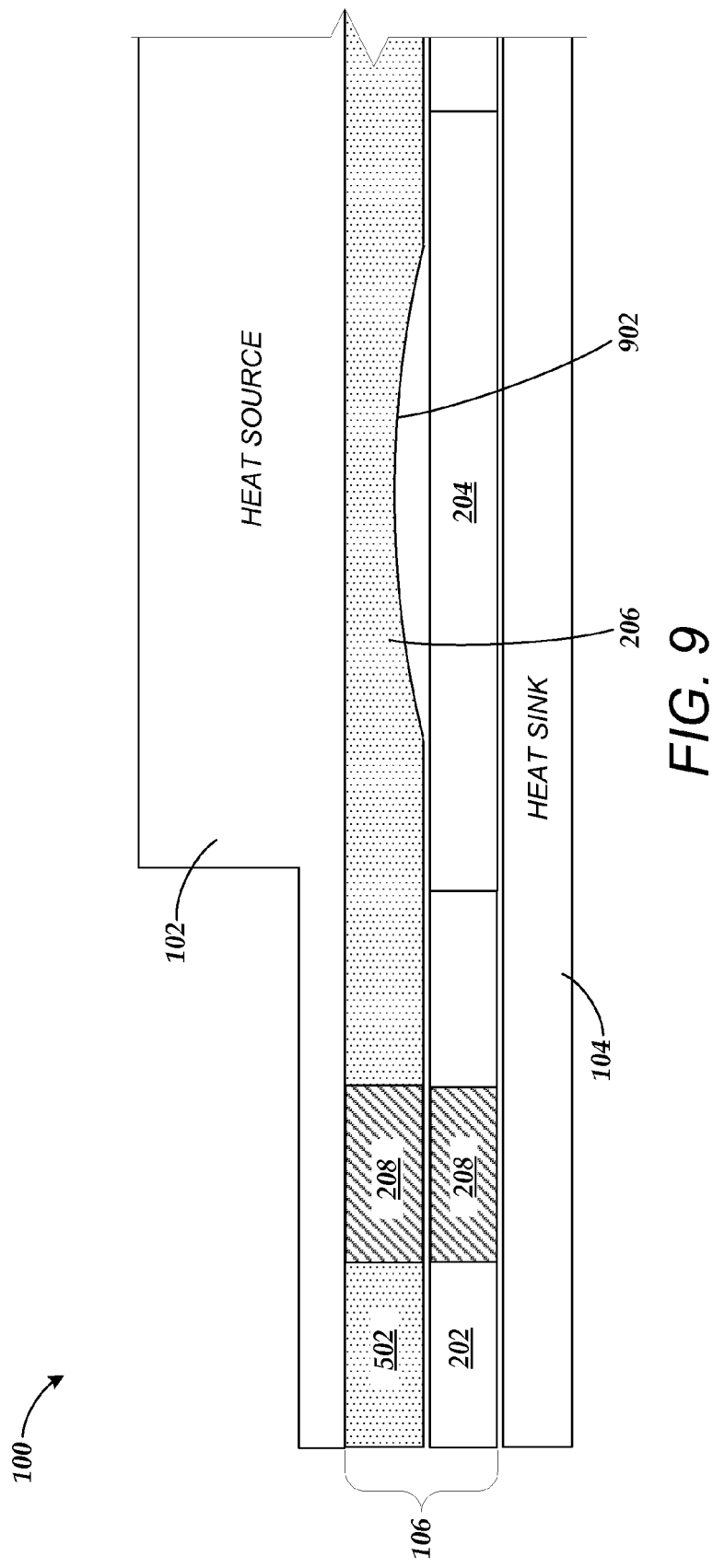
FIG. 9 is a cross-sectional view of a heat dissipation system taken along line A-A of FIG. 5, illustrating an actuated configuration of a thermally switched sheet of a heat dissipation switch according to various embodiments presented herein.

Turning now to FIGS. 8 and 9, a heat dissipation switch 106 having a layer of thermally isolating material 202 and a thermally switched sheet 502 will be described in the context of an alternative embodiment associated with the creation and interruption of the heat flow paths 402 in response to temperature changes. FIG. 8 shows a cross-sectional view of a heat dissipation system 100 taken along line A-A of FIG. 5 with the thermally switched conductive element 206 of the heat dissipation switch 106 configured in an un-actuated configuration. FIG. 9 shows a similar system, but with the thermally switched conductive element 206 configured in an actuated configuration.

In the embodiments discussed above, the thermally switched conductive elements 206 were described and shown as being configured to deform in response to an increase in temperature in order to expand outwards beyond the surfaces of the thermally isolating material 202 to create the heat flow paths 402. Essentially an increase in temperature beyond a threshold temperature associated with the material of the thermally switched conductive elements 206 would trigger a change in the elements from a first state that breaks any heat flow paths 402 to a second state that creates the heat flow paths 402. Conversely, in the embodiments discussed above, the thermally switched conductive elements 206 were described and shown as being configured to react to a decrease in temperature through the threshold temperature to return from the second state to the first state, effectively interrupting the heat flow paths 402.

The embodiment shown in FIG. 8 may be used to illustrate a heat dissipation switch 106 having the opposite response to temperature increases and decreases to provide identical results. For example, the thermally switched conductive element 206 shown in FIG. 8 may be configured such that when undeformed (i.e., no or minimal internal stress within bimetallic elements), the thermally switched conductive element 206 extends through the thermally isolating material 202 to contact the heat sink 104 and create the heat flow paths 402. The thermally switched conductive element 206 is shown with a vent hole 802, which may optionally be placed within the material of the thermally switched conductive element 206 to vent the space of the conductive element cavity 204 between the heat source 102 and the thermally switched conductive element 206.

When the temperature decreases below the threshold temperature, the thermally switched conductive element 206 activates to deform from the first state shown in FIG. 8 to a second state shown in FIG. 9 in which the thermally switched conductive element 206 displaces away from the heat sink 104 and the conductive element cavity 204. It should be appreciated that according to various embodiments, the precise shape of the thermally switched conductive elements 206 may vary. For example, as shown in FIG. 5, the thermally switched conductive elements 206 may be substantially disk-shaped, projecting away from the thermally switched sheet 502, while according to other embodiments as shown in FIG. 9, the thermally switched conductive elements 206 may be configured to be substantially flush with or even recessed from a surface of the thermally switched sheet 502 when configured to isolate the heat source 102 from the heat sink 104. FIG. 9 shows a contact surface 902 configured according to the desired interface between the thermally switched conductive element 206 and the heat sink 104, as will be described below with respect to FIG. 10.

The precise configuration of the thermally switched conductive elements 206 and corresponding contact surface 902 depends on the desired characteristics associated with the specific implementation of the heat dissipation switch 106. Examples include, but are not limited to, type of material of the thermally switched sheet 502 and thermally switched conductive elements 206, shape and dimensions of the thermally switched conductive elements 206, thickness of the conductive element cavities 204, desired actuation times and characteristics associated with the displacement of the thermally switched conductive elements 206, and the desired contact pressure between the thermally switched conductive elements 206 and the heat sink 104.

While FIGS. 8 and 9 have been described as corresponding to un-actuated and actuated states, respectively, of the thermally switched conductive elements 206, it should be appreciated that these examples may also be configured in the opposite manner. Specifically, the thermally switched conductive elements 206 may be configured such that FIG. 8 represents an actuated state of the thermally switched conductive element 206 and FIG. 9 represents an un-actuated state. In doing so, the thermally switched conductive elements 206 would activate to deform from the un-actuated state of FIG. 9 to the actuated state of FIG. 8 upon an increase in temperature past the threshold temperature.

Figure 10:
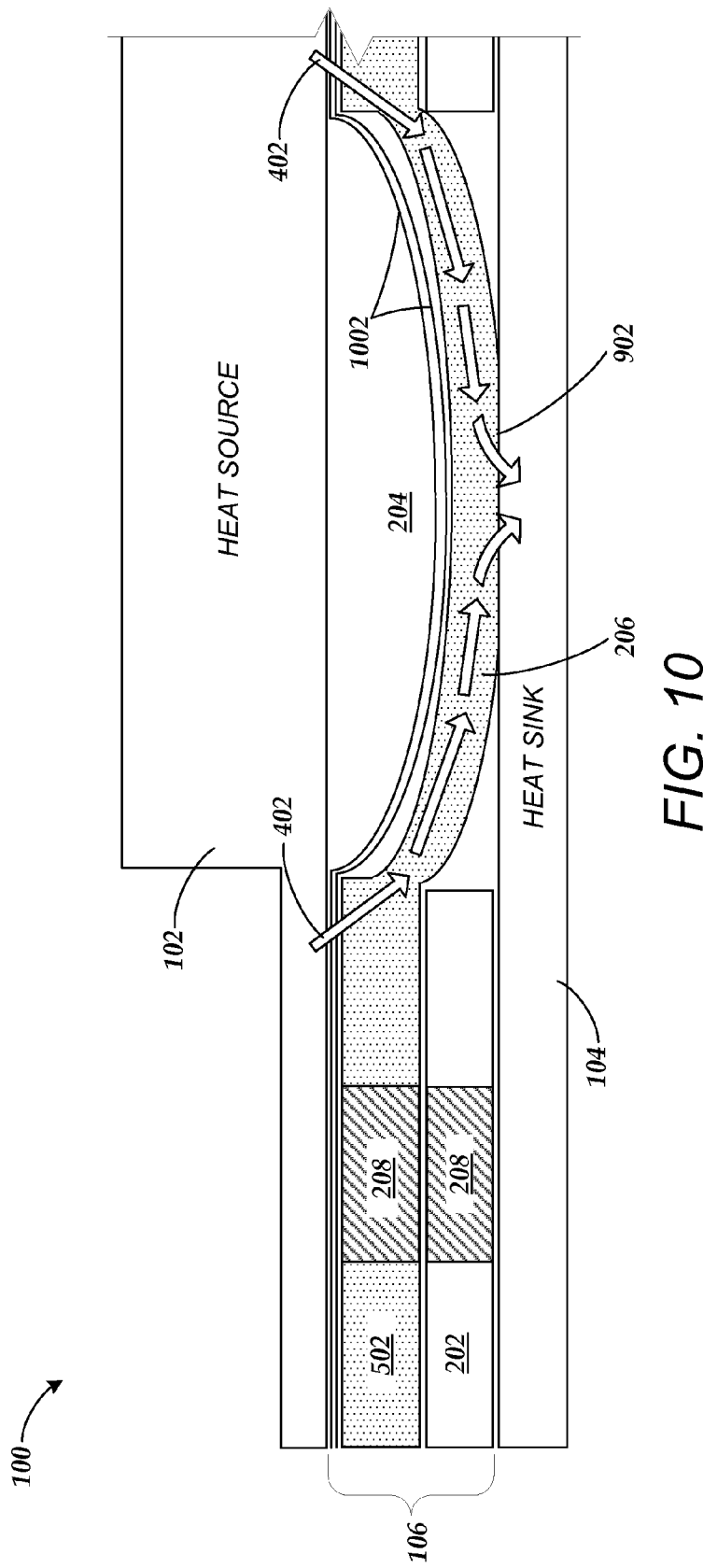
FIG. 10 is a cross-sectional view of a heat dissipation system taken along line A-A of FIG. 5, illustrating various alternative aspects of a thermally switched sheet according to various embodiments presented herein.

Turning to FIG. 10, various alternative aspects of a heat dissipation switch 106 will now be described. The heat dissipation switch 106 of this example utilizes a layer of thermally isolating material 202 adjacent to the heat sink 104 and a thermally switched sheet 502 disposed between the layer of thermally isolating material 202 and the heat source 102 such that the thermally switched conductive elements 206 are positioned to nest within the conductive element cavities 204 of the thermally isolating material 202. As mentioned above, the contact surface 902 of the thermally switched conductive elements 206 may be configured according to the desired interface between the thermally switched conductive elements 206 and the heat sink 104. In this example, the contact surface 902 has been shaped to create a substantially flat contact surface when the thermally switched conductive elements 206 are deformed to the position in which the contact surface 902 abuts a surface of the heat sink 104. In doing so, the contact area between the two surfaces is increased, which in turn increases the heat flow path 402 to improve the capability of the heat dissipation switch 106 to transfer excess heat from the heat source 102 to the heat sink 104.

The heat dissipation switch 106 of FIG. 10 additionally includes one or more supplemental layers 1002 of bimetallic or shape memory alloy material between the thermally switched sheet 502 and the heat source 102. These supplemental layers 1002 may include material having varying deformation characteristics than the thermally switched sheet 502. By having the supplemental layers 1002 with varying deformation characteristics, the response rate and/or actuation pressure of the thermally switched conductive elements 206 may be modified. For example, the supplemental layers 1002 may allow for the buildup of pressure of the thermally switched conductive elements 206 on the heat sink 104, stepping up the pressure incrementally as the temperature increases due to the various characteristics of the materials of the supplemental layers 1002 and the thermally switched sheet 502. According to various embodiments, the supplemental layers 1002 may be added to the entire top surface of the thermally switched sheet 502, or may be localized over a desired subset of thermally switched conductive elements 206 of the thermally switched sheet 502 as desired.

Figure 11:
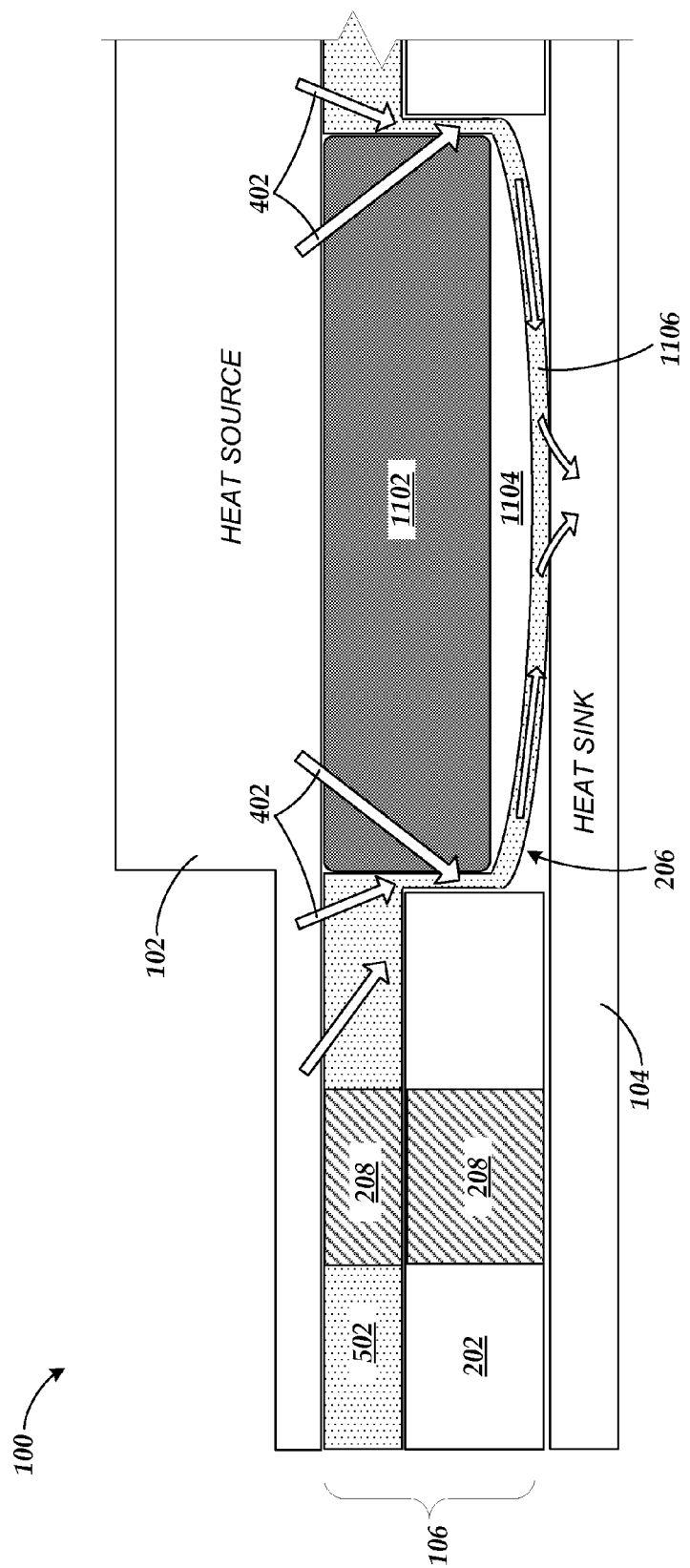
FIG. 11 is a cross-sectional view of a heat dissipation system taken along line A-A of FIG. 5, illustrating an alternative configuration of an illustrative thermally switched sheet according to various embodiments presented herein.

FIG. 11 illustrates another implementation of the heat dissipation switch 106 according to various embodiments. This example includes a heat dissipation switch 106 having a layer of thermally isolating material 202 and a thermally switched sheet 502, similar to the examples described above. However, in this example, the thickness of the thermally isolating material 202 has been increased to provide an increased thermal isolation between the heat source 102 and the heat sink 104. Increasing the thickness of the thermally isolating material 202 may correspondingly increase the depth of the conductive element cavities 204 (space shown occupied by reference numbers 1102 and 1104). Accordingly, the thermally switched sheet 502 may be configured so that the thermally switched conductive elements 206 project downward into the conductive element cavities 204, with the primary deformation portions 1106 of the thermally switched conductive elements 206 spanning the width of the conductive element cavities 204. This configuration may leave an open cylindrical cavity (space shown occupied by reference number 1102) above the primary deformation portions 1106 of the thermally switched conductive elements 206 within the conductive element cavities 204.

According to one embodiment, the open cylindrical cavities created by the configuration of the primary deformation portions 1106 of the thermally switched conductive elements 206 may each be filled with a conductive plug 1102 of solid conductive material. The conductive plug 1102 may be capable of transferring excess heat from the heat source 102 to the thermally switched conductive elements 206 once the primary deformation portions 1106 make contact with the heat sink 104 to create the heat flow paths 402. The conductive plugs 1102 may be sized and shaped to increase the amount of conductive material between the heat source 102 and the heat sink 104 without interfering with the actuation of the primary deformation portions 1106. According to the example shown, upon actuation of the primary deformation portions 1106 of the thermally switched conductive elements 206, the shape of the conductive plugs 1102 creates a small nonconductive space 1104 between the conductive plugs 1102 and the primary deformation portions.

Figure 12:
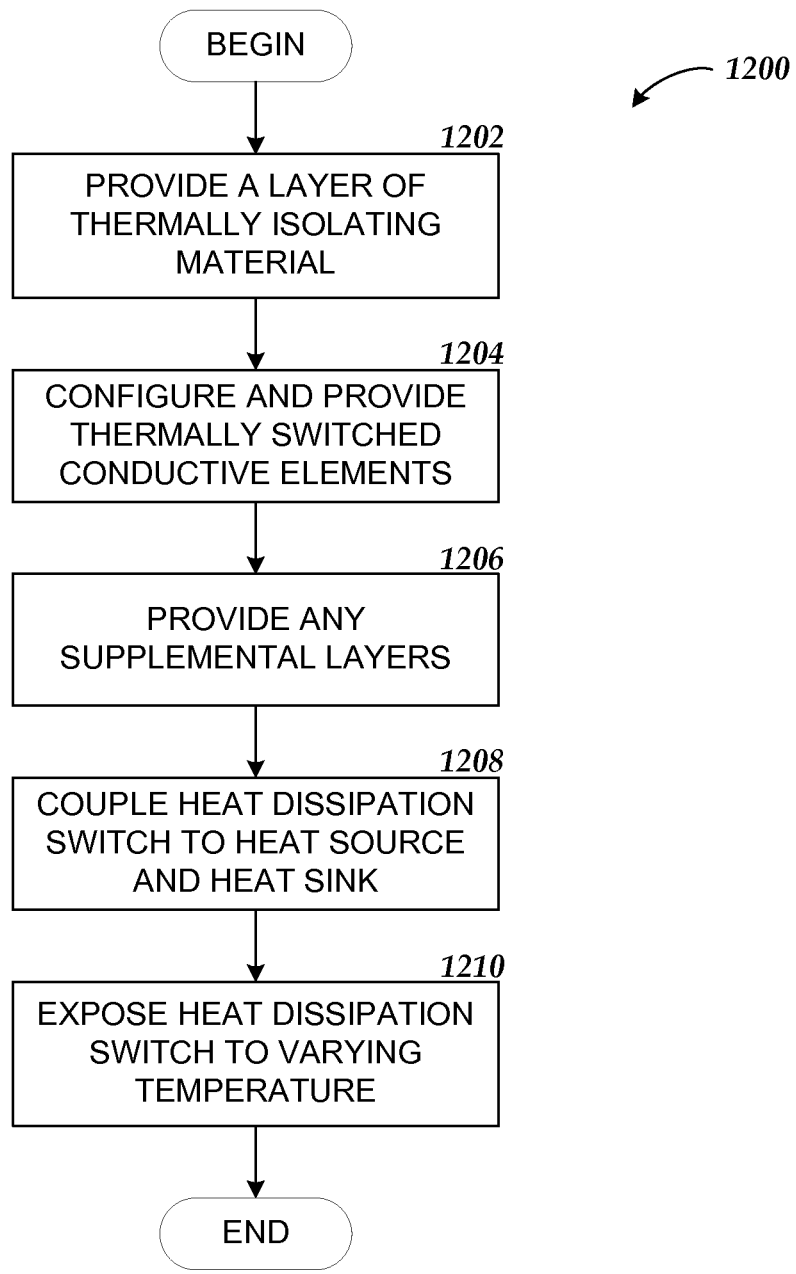
FIG. 12 is a flow diagram showing a method of removing heat from a heat source according to various embodiments presented herein.

Turning now to FIG. 12, an illustrative routine 1200 for removing excess heat from a heat source 102 will now be described in detail. It should be appreciated that more or fewer operations may be performed than shown in the FIG. 12 and described herein. Moreover, these operations may also be performed in a different order than those described herein. The routine 1200 begins at operation 1202, where a layer of thermally isolating material 202 is provided. As discussed in detail above, the thermally isolating material 202 may include any number of conductive element cavities 204 arranged according to any desired configuration. Further, the thermally isolating material 202 may be configured according to the characteristics of the surface to which the thermally isolating material 202 will be mounted, such as according to a surface mount configuration 210 or an edge mount configuration 220.

The routine 1200 continues from operation 1202 to operation 1204, where the thermally switched conductive elements 206 are configured and provided as either individual non-coupled elements as shown in FIGS. 2-4, or as a thermally switched sheet 502 as shown in FIGS. 5-11. Configuring the thermally switched conductive elements 206 may also include selecting a suitable material for the elements, as well as the shape and size of all of the thermally switched conductive elements 206 and/or any subsets of the thermally switched conductive elements 206. The routine 1200 continues to operation 1206, where any supplemental layers 1002 may be selected, configured, and added to the heat dissipation switch 106 according to the desired performance characteristics of the thermally switched conductive elements 206 for the particular application of the heat dissipation switch 106.

At operation 1208, the heat dissipation switch 106 may be coupled to the heat source 102 and to the heat sink 104 using adhesives, fasteners, or some combination of these or other known coupling techniques to create the heat dissipation system 100. The routine 1200 continues to operation 1210, where the heat dissipation switch 106 is exposed to increasing or decreasing temperatures to selectively activate or deactivate the switch in order to create or interrupt the heat flow paths 402 for controlling the dissipation of excess heat created by the heat source 102.

It should be clear from discussion above that the concepts described herein may be used independently or in combination to selectively remove excess heat from a heat source according to a threshold temperature or temperature range. The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

What is claimed is:

1. A heat dissipation switch, comprising:
   a layer of thermally isolating material comprising a plurality of conductive element cavities within the thermally isolating material; and
   a plurality of thermally switched conductive elements disposed within the plurality of conductive element cavities of the thermally isolating material, wherein each thermally switched conductive element is configured to deform in response to a threshold temperature.

2. The heat dissipation switch of claim 1, wherein the plurality of thermally switched conductive elements are arranged in an array.

3. The heat dissipation switch of claim 1, wherein the plurality of thermally switched conductive elements are not thermally coupled to one another, and wherein each of the thermally switched conductive elements is nested unsecured within a conductive element cavity of the thermally isolating material.

4. The heat dissipation switch of claim 3, wherein the plurality of thermally switched conductive elements comprises bimetallic material.

5. The heat dissipation switch of claim 3, wherein the plurality of thermally switched conductive elements comprises a shape memory alloy.

6. The heat dissipation switch of claim 1, wherein being configured to deform in response to the threshold temperature comprises being configured to deform from a first state to a second state as a temperature increases beyond the threshold temperature and to return from the second state to the first state as the temperature decreases beyond the threshold temperature.

7. The heat dissipation switch of claim 1, wherein being configured to deform in response to the threshold temperature comprises being configured to deform from a first state to a second state as a temperature decreases beyond the threshold temperature and to return from the second state to the first state as the temperature increases beyond the threshold temperature.

8. The heat dissipation switch of claim 1, wherein the plurality of thermally switched conductive elements are thermally coupled to one another to create a thermally switched sheet of conductive elements, and wherein each of the thermally switched conductive elements is nested within a conductive element cavity of the thermally isolating material.

9. The heat dissipation switch of claim 8, wherein the plurality of thermally switched conductive elements comprises bimetallic material.

10. The heat dissipation switch of claim 8, wherein the plurality of thermally switched conductive elements comprises a shape memory alloy.

11. The heat dissipation switch of claim 1, wherein the plurality of thermally switched conductive elements comprise a first subset of thermally switched conductive elements configured to deform in response to a first threshold temperature and a second subset of thermally switched conductive elements configured to deform in response to a second threshold temperature different than the first threshold temperature.

12. The heat dissipation switch of claim 1, wherein the heat dissipation switch is configured according to a surface mount configuration having a continuous surface area comprising thermally isolating material and the plurality of thermally switched conductive elements, the continuous surface area bounded by a perimeter of the layer of thermally isolating material.

13. The heat dissipation switch of claim 1, wherein the heat dissipation switch is configured according to an edge mount configuration having a surface area bordered on an outer edge by a perimeter of the layer of thermally isolating material and on an inner edge by a non-switched area.

14. The heat dissipation switch of claim 1, wherein each of the plurality of thermally switched conductive elements is configured such that deformation of the thermally switched conductive element in response to the threshold temperature extends the thermally switched conductive element below a lower surface of the layer of thermally isolating material to create a heat flow path between a heat source and a heat sink positioned on opposing sides of the heat dissipation switch.

15. The heat dissipation switch of claim 1, wherein each of the plurality of thermally switched conductive elements is configured such that deformation of the thermally switched conductive element in response to the threshold temperature withdraws the thermally switched conductive element from below a lower surface of the layer of thermally isolating material to interrupt a heat flow path between a heat source and a heat sink positioned on opposing sides of the heat dissipation switch.

16. The heat dissipation switch of claim 1, wherein each of the plurality of thermally switched conductive elements comprises a substantially flat contact surface when deformed in response to the threshold temperature.

17. The heat dissipation switch of claim 1, further comprising at least one supplemental layer of thermally switched conductive elements disposed in a position between a thermally switched conductive element and a heat source, wherein the at least one supplemental layer is configured to deform in response to a secondary threshold temperature different than the threshold temperature.

18. The heat dissipation switch of claim 1, further comprising a conductive plug of thermally conductive material disposed within a cavity of a thermally switched conductive element such that deformation of the thermally switched conductive element in response to the threshold temperature extends the thermally switched conductive element below a lower surface of the layer of thermally isolating material to create a heat flow path from a heat source, through the conductive plug, and to a heat sink positioned on opposing sides of the heat dissipation switch.

19. A method of removing heat from a heat source, comprising:
    providing a layer of thermally isolating material between the heat source and a heat sink, the thermally isolating material having a plurality of conductive element cavities;
    providing a plurality of thermally switched conductive elements within the plurality of conductive element cavities, the plurality of thermally switched conductive elements configured to deform in response to a threshold temperature; and
    exposing the plurality of thermally switched conductive elements to the threshold temperature such that deformation of the plurality of thermally switched conductive elements creates or eliminates a heat flow path from the heat source to the heat sink.

20. The method of claim 19, wherein the plurality of thermally switched conductive elements are not thermally coupled to one another, and wherein each of the thermally switched conductive elements is nested unsecured within a conductive element cavity of the thermally isolating material.

21. The method of claim 19, wherein the plurality of thermally switched conductive elements are thermally coupled to one another to create a thermally switched sheet of conductive elements, and wherein each of the thermally switched conductive elements is nested within a conductive element cavity of the thermally isolating material.

22. The method of claim 19, wherein the plurality of thermally switched conductive elements comprises bimetallic material.

23. The method of claim 19, wherein the plurality of thermally switched conductive elements comprises a shape memory alloy.

24. A heat dissipation system, comprising:
    a heat source;
    a heat sink; and
    a heat dissipation switch positioned between the heat source and the heat sink, the heat dissipation switch comprising
        a layer of thermally isolating material having a plurality of conductive element cavities, and
        a plurality of thermally switched conductive elements disposed within the plurality of conductive element cavities and configured to deform in response to a threshold temperature to contact the heat sink and create or eliminate a heat flow path between the heat source and the heat sink.

25. The heat dissipation system of claim 24, wherein the plurality of thermally switched conductive elements are not thermally coupled to one another, and wherein each of the thermally switched conductive elements is nested unsecured within a conductive element cavity of the thermally isolating material.

26. The heat dissipation system of claim 24, wherein the plurality of thermally switched conductive elements are thermally coupled to one another to create a thermally switched sheet of conductive elements, and wherein each of the thermally switched conductive elements is nested within a conductive element cavity of the thermally isolating material.

27. The heat dissipation system of claim 24, wherein the plurality of thermally switched conductive elements comprises bimetallic material.

28. The heat dissipation system of claim 24, wherein the plurality of thermally switched conductive elements comprises a shape memory alloy.

* * * * *